United States Patent
Santan et al.

(10) Patent No.: US 9,135,384 B1
(45) Date of Patent: Sep. 15, 2015

(54) COMPILATION AND SIMULATION OF A CIRCUIT DESIGN

(75) Inventors: Sonal Santan, San Jose, CA (US); Hem C. Neema, Sunnyvale, CA (US); Valeria Mihalache, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 515 days.

(21) Appl. No.: 13/468,942

(22) Filed: May 10, 2012

(51) Int. Cl.
*G06F 17/50* (2006.01)

(52) U.S. Cl.
CPC .................................. *G06F 17/5036* (2013.01)

(58) Field of Classification Search
CPC ............ G06F 17/5036; G06F 17/5009; G06F 17/5022; G06F 11/261; G06F 13/105; G06F 17/5045; G06F 8/10; G06F 17/5063; G01R 31/318357; G01R 31/318364; G05B 17/02; H04L 41/145
USPC .............................................. 703/3, 4, 13, 14
See application file for complete search history.

(56) References Cited

U.S. PATENT DOCUMENTS

| | | | |
|---|---|---|---|
| 6,173,243 B1* | 1/2001 | Lowe et al. ...................... | 703/14 |
| 7,007,249 B2* | 2/2006 | Ly et al. ........................ | 716/103 |
| 7,080,365 B2 | 7/2006 | Broughton et al. | |
| 8,407,433 B2* | 3/2013 | Wingard et al. ............... | 711/157 |
| 8,644,305 B2* | 2/2014 | Clark et al. .................... | 370/362 |
| 2004/0162717 A1 | 8/2004 | Nouri et al. | |
| 2005/0198606 A1 | 9/2005 | Gupta et al. | |
| 2007/0245277 A1* | 10/2007 | Chen ................................. | 716/5 |
| 2010/0153083 A1 | 6/2010 | Bobok et al. | |
| 2012/0198405 A1* | 8/2012 | Bhushan et al. .............. | 716/112 |
| 2012/0233578 A1 | 9/2012 | Karlsson | |

OTHER PUBLICATIONS

U.S. Appl. No. 13/347,301, filed Jan. 10, 2012, Mihalache et al.
U.S. Appl. No. 13/468,927, filed May 10, 2012, Neema et al.
U.S. Appl. No. 13/468,933, filed May 10, 2012, Deshpande et al.

\* cited by examiner

*Primary Examiner* — Omar Fernandez Rivas
*Assistant Examiner* — Shiuh-Huei Ku
(74) *Attorney, Agent, or Firm* — LeRoy D. Maunu

(57) ABSTRACT

In one embodiment, a method for compiling an HDL specification for simulation of a circuit design is provided. Using one or more processors the circuit design is elaborated from the HDL specification. Two or more instances of a module of the elaborated design that have a same hardware configuration are determined. Simulation code that models the circuit design is generated. A first portion of the simulation code is configured to model the module having the hardware configuration. For each of the two or more instances, a second portion of the simulation code is configured to, in response to an indication to simulate the instance, execute the first portion of simulation code using a respective set of nets corresponding to the instance.

18 Claims, 5 Drawing Sheets

COMPILATION AND SIMULATION OF A CIRCUIT DESIGN

FIELD OF THE INVENTION

One or more embodiments generally relate to the simulation of circuit designs.

BACKGROUND

Due to advancements in processing technology, complex integrated circuits (ICs) can be designed at various levels of abstraction. Using a hardware description language (HDL), circuits can be designed at the gate level, the register transfer level (RTL), and higher logical levels. When designing using an HDL, the design is often structured in a modular manner. The designer describes each module as a process describing behavior of a system, the behavior describing the generation and propagation of signals through combinatorial logic from one set of registers to another set of registers. HDLs provide a rich set of constructs to describe the functionality of a module. Modules may be combined and augmented to form even higher-level modules.

Prior to implementation, an HDL-based design can be simulated to determine whether the design will function as required. Wasted manufacturing costs due to faulty design may thereby be avoided. Numerous tools are available for simulating circuit designs including, for example, high-level modeling systems (HLMS) and HDL simulators.

Simulation of an HDL-based design includes a compilation phase and a runtime simulation phase. In the compilation phase, HDL source code is input, analyzed, and elaborated to generate executable simulation code. In the runtime simulation phase, the code generated in the compilation phase is executed by a simulation engine to simulate the design. From a user's perspective, HDL simulators work by compiling the HDL-based design once, and then executing the compiled design many times for different sets of input values during the runtime phase. Therefore, the runtime performance of HDL simulators is of critical importance and may be more important than compile time performance in many cases.

An HDL-based design is a hierarchy of modules whose behavior is described by HDL processes. When the HDL-based design is written in VHDL, an HDL process corresponds to either a VHDL process, a concurrent signal assignment, or a concurrent assertion. When the HDL-based design is written in the Verilog language, an HDL process corresponds to either a Verilog always block, an initial block, an assign statement, or a gate. Procedure calls may or may not be regarded as HDL processes. From a hardware perspective, the HDL processes represent hardware that responds to changes in inputs. For example, a change to an output of one circuit may trigger responses in multiple circuits having inputs coupled to the output.

HDL simulators schedule execution of HDL statements such that global variables or signals input to the HDL statements are properly updated and race conditions between concurrent HDL statements are avoided. Simulation of HDL processes is performed over a number of simulation cycles. Each simulation cycle begins with updates to values of nets. Each net, which may be a VHDL signal or a Verilog net, represents values transmitted on a wire of a circuit design. For ease of reference, VHDL signals and Verilog nets may be referred to as either signals or nets, and such terms are used interchangably herein. Each update to a net may trigger a number of processes which model how a hardware implementation of the design would respond. Module processes dependent on the updated nets are scheduled and executed in a delta cycle.

Depending on the circuit design, a net may be changed or updated by the output of multiple module processes. Each process output that may affect the value of a net is referred to as a driver. If a process has several statements that assign values to the same net, only one driver for the net is created per process. The value of the driver is computed from all the values assigned to that net in the process, according to predefined language rules. A net that has at most one driver for each bit is said to be singly-driven. A net that has several drivers on the same set of bits is said to be multiply-driven.

When a net is driven by multiple drivers, a value of the net is determined when nets are updated at runtime using a resolution function. The value computed by the resolution function is referred to as the resolved value, and the resolved value will be assigned as the new value of the net. The process of computing the new value from the driver values of a net is called driver resolution. The resolution function can be standard, defined by the HDL language itself or, for VHDL, can be user-defined.

An HDL specification may include multiple instances of a call to a process. For each instance, the process is simulated using a respective set of nets and respective set of variables. Previous approaches generate a separate portion of code during compilation for each instance of a call to a process. As a result, the amount of simulation code to be executed at simulation runtime and memory requirements can be relatively large.

One or more embodiments may address one or more of the above issues.

SUMMARY

In one embodiment, a method for compiling an HDL specification for simulation of a circuit design is provided. Using one or more processors, the circuit design is elaborated from the HDL specification. Two or more instances of a module of the elaborated design that have a same hardware configuration are determined. Simulation code that models the circuit design is generated. A first portion of the simulation code is configured to model the module having the hardware configuration. For each of the two or more instances, a second portion of the simulation code is configured to, in response to an indication to simulate the instance, execute the first portion of simulation code using a respective set of nets corresponding to the instance.

In another embodiment, a method of simulating a circuit design having multiple instances of a module with the same hardware configuration is provided. Simulation is performed using a compiled HDL specification of the circuit design, including a first portion of simulation code configured and arranged to model the module. Using one or more processors, in response to an indication to simulate one of the instances of the module during simulation, the first portion of simulation code is executed using a respective set of nets corresponding to the instance.

In yet another embodiment, an article of manufacture is provided. The article is characterized by a non-transitory electronically readable medium having stored instructions. When loaded into a processor, the instructions cause the processor to receive and compile a hardware description language (HDL) specification for simulation of a circuit design. In the compilation process, the processor elaborates the circuit design from the HDL specification, and determines two or more instances of a module of the elaborated design that have a same hardware configuration. The processor generates and stores, on a storage device, simulation code that models the circuit design. A first portion of the simulation code is configured to model the module having the hardware configuration. For each of the two or more instances, a second portion of the simulation code is configured to, in response to an indication to simulate the instance, execute the first portion of simulation code using a respective set of nets corresponding to the instance.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Software-based simulators compile HDL statements into native executable code of a host computer. One or more embodiments reduce the size of generated simulation code that needs to be executed at simulation runtime by generating simulation code for a process such that the generated simulation code can be used to simulate all identical instances of that process. The code generated for a process is configured to operate using a different set of nets and variables for each instance of the process.

Figure 1:
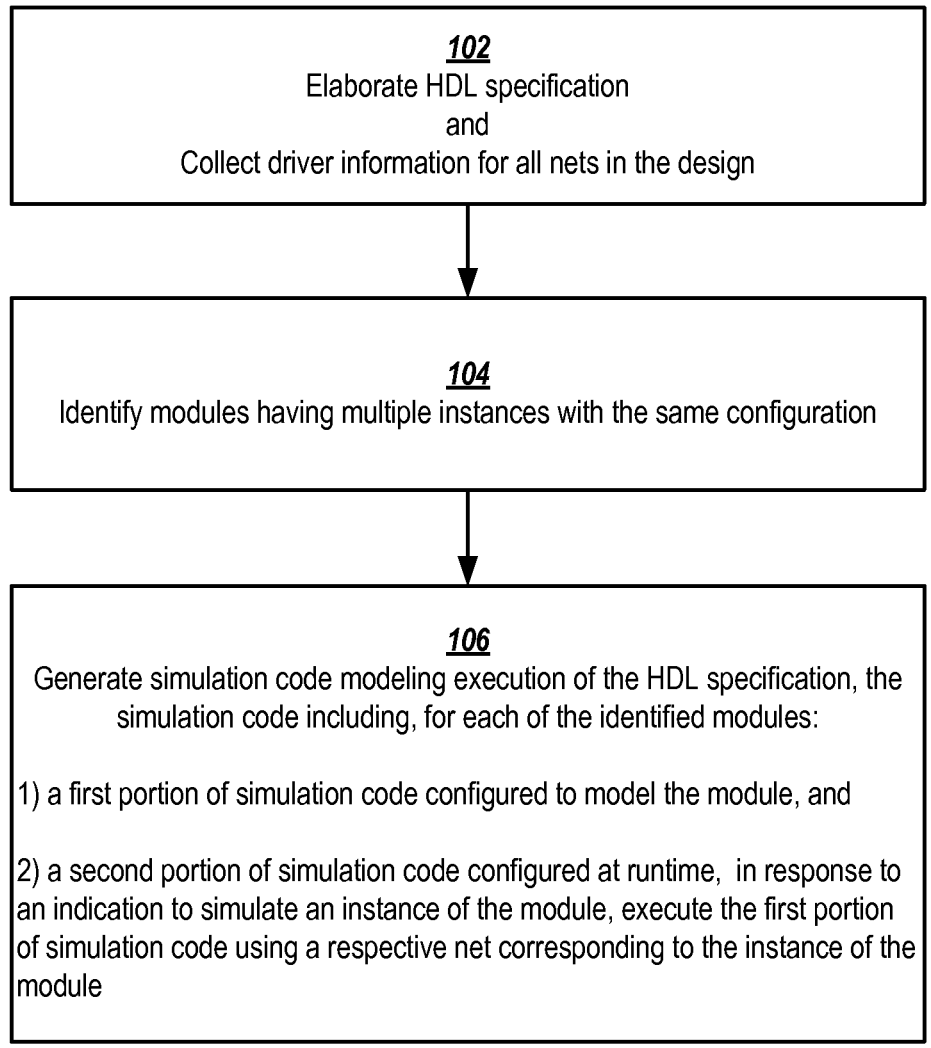
FIG. 1 shows a process for compiling an HDL circuit design in accordance with one of more embodiments.

FIG. 1 shows a flowchart of a process for compiling an HDL specification in accordance with one or more embodiments. An HDL circuit design specification is elaborated at block 102, and driver information is collected for all nets of the design. Modules having multiple instances with the same configuration in the HDL circuit design specification (i.e., same ports connecting to respective sets of nets) are identified at block 104. For each of the modules identified as having multiple instances at block 104, a first portion of simulation code is generated to model the process at block 106. Also at block 106, a second portion of simulation code is generated, and the second portion is configured at runtime to simulate an instance of the module by executing the first portion of simulation code using a respective net corresponding to the instance of the module. The second portion of simulation code may implement a simulation kernel that calls respective functions to simulate different modules of an HDL specification. The first portion of the simulation code implements a function configured to simulate the respective modules using a set of nets indicated in an argument of the function when called by the simulation kernel.

In an HDL simulation, a net is used to model a set of properties and a set of actions for a signal/wire declaration. The HDL specification indicates formals that are declarations of inputs and outputs of each instance of a module, actuals indicating signals passed to and from the formals during simulation runtime, and nets connecting the formals to the actuals. Because the generated simulation code for a process in the module is configurable to simulate multiple instances of that process in all identical instances of that module, formals of a module may require different nets for different instances of the module. In one or more embodiments, an aggregate net is used to connect multiple alternative actuals to a formal of a module. An aggregate net represents multiple nets combined together to create a virtual net that may be linked to a formal. The mapping performed by each aggregate net is maintained as an array of aggregate net elements. Aggregation of nets is distinguishable from net splitting, in which multiple alternative formals connect to the same actual. A declared net represents a single net connected to a formal, which happens when a single actual is connected to a formal.

In some embodiments, a data structure is created for each instance of a module identified during compilation. For each aggregate net connected to a formal of the module, the data structure includes a reference pointer to the aggregate net and an offset, from the memory address indicated by the reference pointer, corresponding to the module instance. For ease of reference, the reference pointer and the offset for each formal indicated by the data structure may be referred to as a netview. For aggregate nets, each netview stores a reference pointer to the aggregate net and an offset, where the net connected to the formal for the particular instance can be located in the aggregate net. For instance, in a port map having an actual connected to a formal in a bit range of 5 to 8 in an aggregate net, the netview for the formal would indicate an offset of 5 in addition to the reference pointer to the aggregate net. Netviews are also created when a formal is connected to a declared net. This leads to a layout where several netviews in different levels of design hierarchy are connected to either an aggregate net or a declared net and can provide different views of the same net to different module instances.

As the HDL design is elaborated during compilation, nets, netviews, and corresponding data structures are created. Both nets and netviews are created for local signal, wire, and register declarations in a module instance. For port maps, the compiler builds a table in which each formal is mapped to the range of the net corresponding to the actual. If a formal of a module is connected to multiple actuals, then the compiler creates an aggregate net for the formal. The formal is then mapped to the full range of this newly created aggregate net. Using information in the table, the compiler creates netviews for the formals. The compiler places all netviews of all identical instances of a module at the same relative offset from the address indicated by the module itself. The consistent placement of netviews helps to generate efficient code that may be used for simulation of any instances of a module.

In some implementations, aggregate nets may be constructed during compilation using recursion. Recursion is efficient for construction of aggregate nets because net elements forming the aggregate nets may be aggregate nets as well. In such implementations, the compiler traverses a table of net elements of such aggregate nets and extracts the declared nets from the latter. These declared nets are then used to build the final aggregate net element array. The recursive process consolidates aggregate nets to produce a flattened table of declared nets having ranges matched with corresponding ranges of the formal with no other intervening aggregate nets. The flattening helps to build one level aggregate net element array, which is irrespective of the depth of the hierarchy and ignores any other aggregate net, which might fall in between. This flattening of aggregate nets insulates scheduling of aggregate nets from the hierarchical depth of the design resulting in linear time performance. Similarly, updating of aggregate nets, discussed in more detail with respect to FIG. 4, becomes a linear time operation.

Some aspects are described with reference to an HDL code specification as shown in Example 1.

```
entity bot is
port (
    val:inout std_logic_vector(2 to 5));
end bot;
architecture bot of bot is
begin
    val(3 to 4)<=foo( );
end bot;
entity mid is
port (
    data1:inout std_logic_vector(0 to 7);
    data2:inout std_logic_vector(0 to 7));
end mid;
architecture mid of mid is
begin
    dut:entity work.bot(bot) port map (val=>data2(1 to 4));
end mid;
entity top is
end top;
architecture top of top is
    signal aa, bb:std_logic_vector(0 to 3);
    signal cc:std_logic_vector(0 to 15);
begin
    dut0:entity work.mid(mid) port map (data1(0 to 3)=>aa,
        data1(4 to 7)=>bb, data2=>cc(8 to 15));
    dut1:entity work.mid(mid) port map (data1=>cc(0 to 7),
        data2(0 to 1)=>bb(0 to 1), data2(2 to 3)=>aa(1 to 2),
        data2(4 to 5)=>cc(2 to 3), data2(6 to 7)=>"11");
end top;
```

EXAMPLE 1

Figure 2:
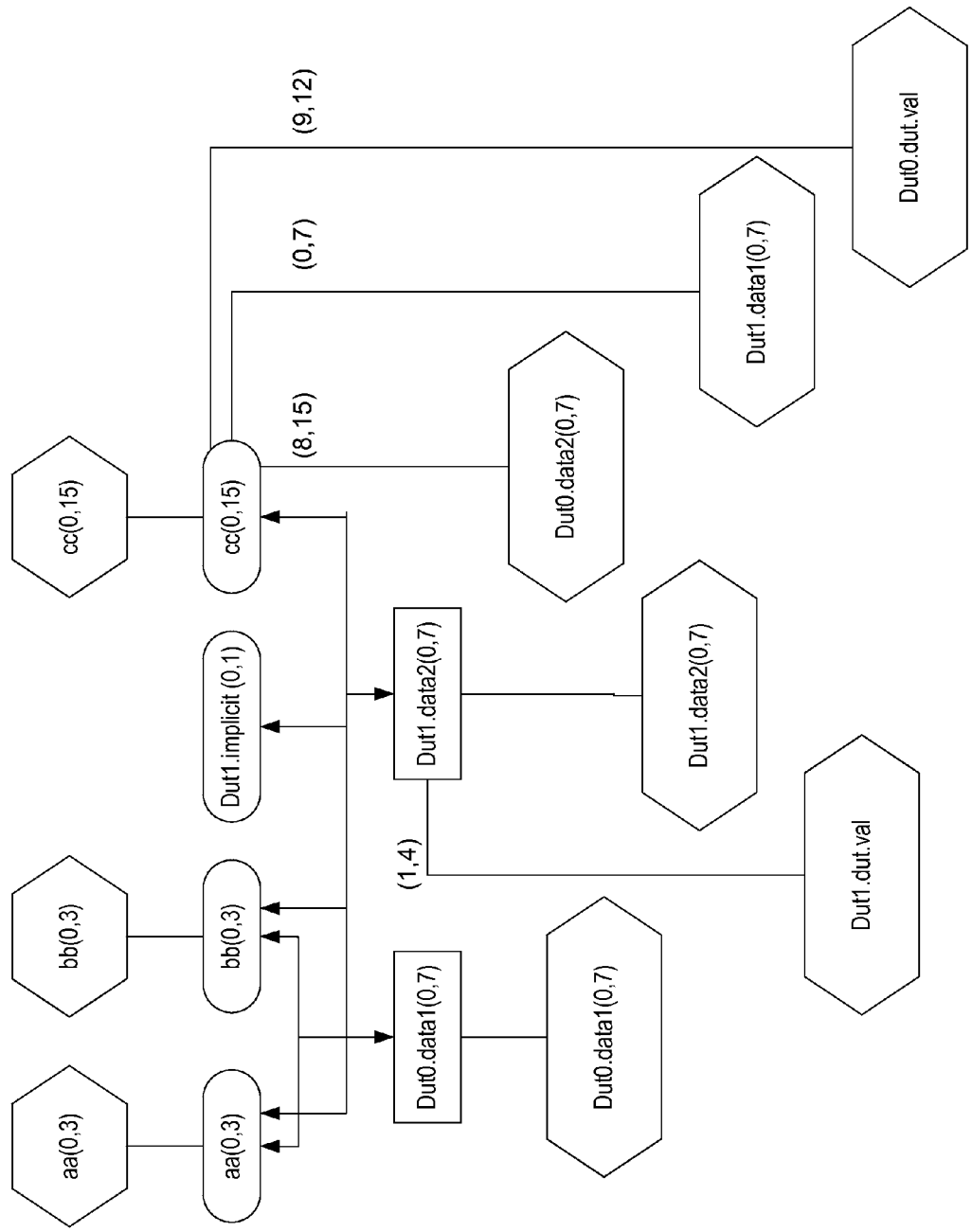
FIG. 2 shows a diagram of aggregate and actual nets illustrating organizational relationship of nets for an example set of signal declarations provided in Example 1.
Figure 3:
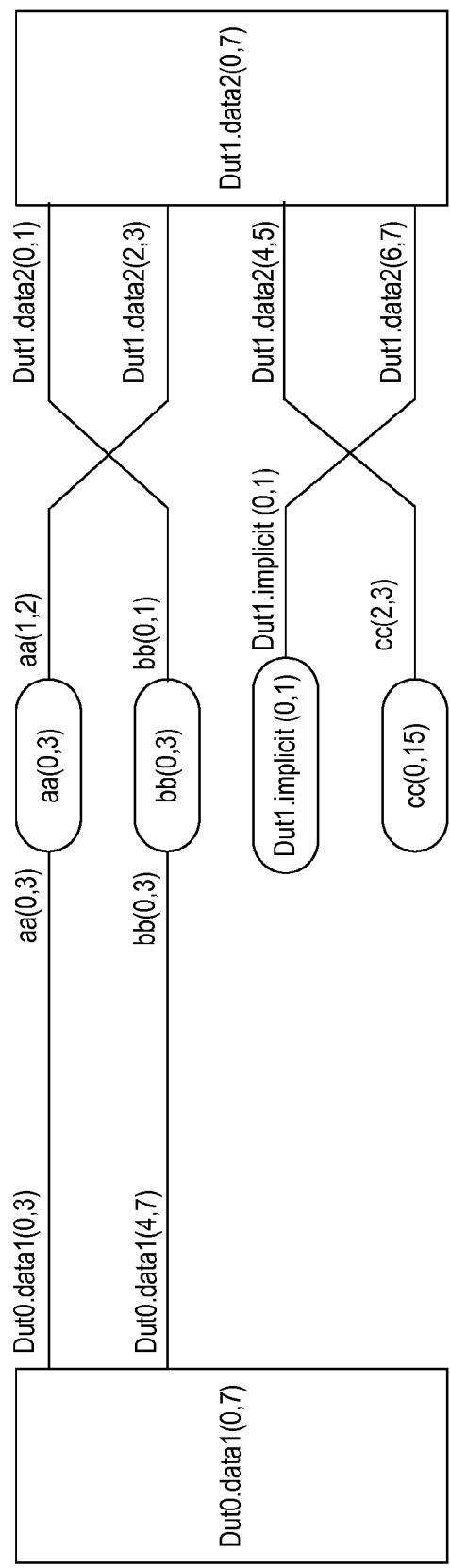
FIG. 3 shows a diagram of aggregate and actual nets illustrating mapping of aggregate nets and actuals for the example set of signal declarations provided in Example 1.

In the HDL specification shown in Example 1, top level signals: aa, bb, and cc create nets. These nets connect to formals of two identical instances of a module work.mid (dut0 and dut1). FIGS. 2 and 3 show net elements for each of the two aggregate nets found in the HDL code of Example 1, respectively. As used in FIGS. 2 and 3, netviews are depicted as hexagons, actuals are depicted as ovals, and aggregate nets are depicted as rectangles. FIG. 2 shows a diagram illustrating the organizational relationship of netviews, nets, and actuals for the set of declarations and mapping shown in Example 1. FIG. 3 illustrates the mapping of different actual bit-ranges to form the aggregate nets Dut0.data1 and Dut1.data2.

The compiler generates code for the module work.mid, which is configurable to simulate either of the module instances dut0 or dut1 of work.mid. The executable code uses the netviews for ports data1 and data2 to read and update the value. Update of nets may be performed by scheduling of transaction functions on the nets that are connected to data1 and data2 through the netview. The executable code uses the netviews for ports data1 and data2 to read and update the value. As shown in FIG. 2, port dut0.data1 of instance dut0 is connected to an aggregation of nets aa and bb. Port dut0.data2 of instance dut0 is connected to net cc. Port dut1.data1 is connected to net cc. Port dut1.data2 is connected to an aggregation of nets aa, bb, cc and an anonymous net with a constant value of "11". FIG. 3 illustrates a detailed mapping between bitranges of aggregate nets Dut0.data1 and Dut1.data1 and nets aa, bb, cc, and the anonymous net.

In some embodiments, netviews are used to facilitate scheduling of nets. The netviews do not store net values but instead obtain values from the associated aggregate net after applying the corresponding offset. The netviews provide a simplified interface for the generated code used to model a module instance to read from and write to nets. Similar to declared nets, aggregate nets have respective transaction functions for updating the net values. Each transaction function may also be configured to schedule module processes sensitive to the updated net. Transaction functions for nets are called by the simulation kernel when the transactions for those nets are updated. In some embodiments, aggregate net transaction functions are not directly called by the simulation kernel. Rather, transaction functions corresponding to a net may be indirectly updated, after actuals have been updated, to propagate the new values from declared nets to the aggregate nets.

Figure 4:
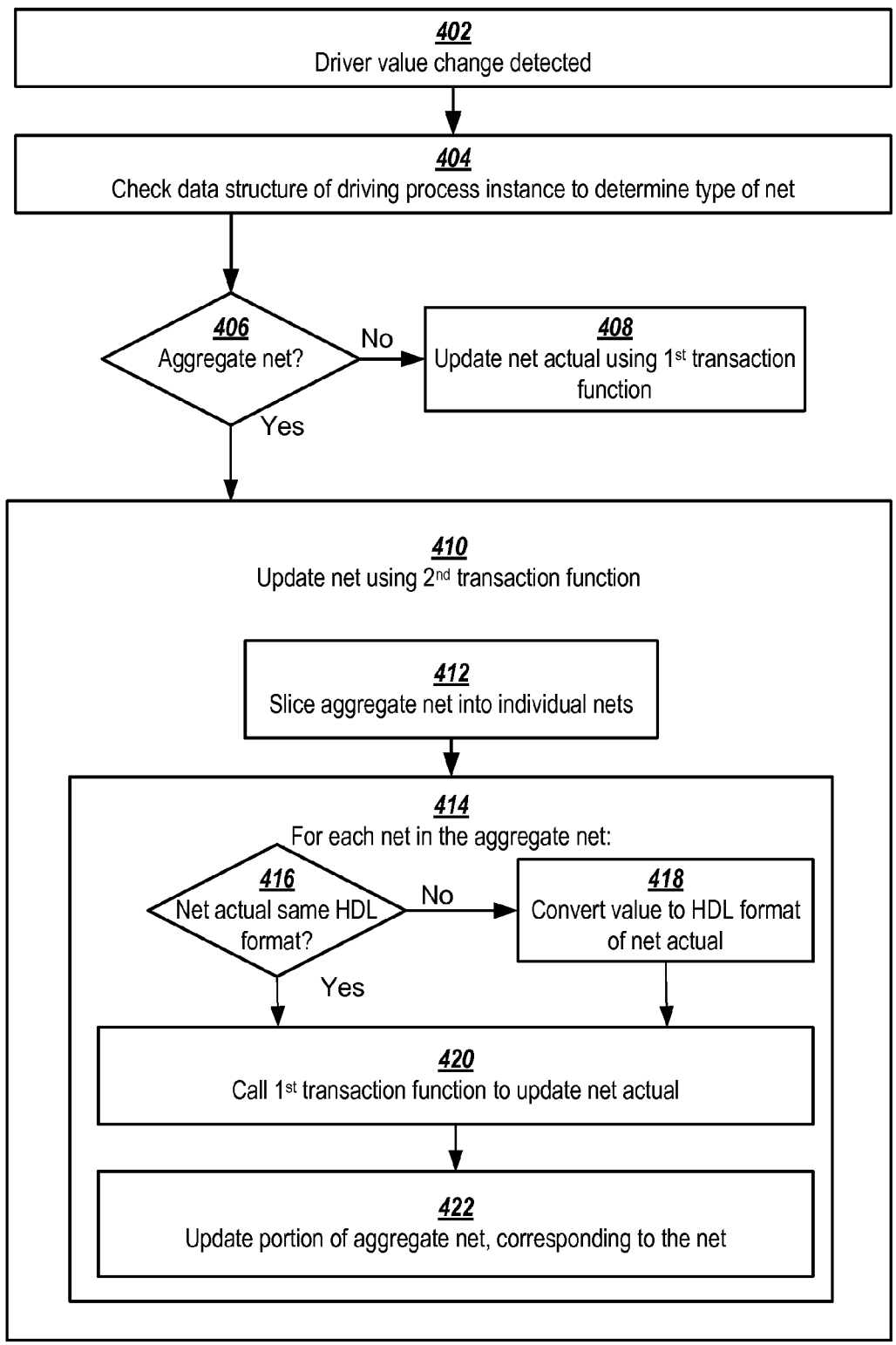
FIG. 4 shows a process for updating net driver values at runtime in accordance with one or more embodiments.

FIG. 4 shows a process for updating net values at runtime in accordance with one or more embodiments. A driver change to a net is detected at block 402. A data structure of the driving module is checked to determine the type of net at block 404. In response to the net not being an aggregate net at decision block 406, the actual of the net is updated using a first transaction function at block 408. A respective first transaction function is generated during compilation for each actual net of the HDL specification.

In response to the net being an aggregate net at decision block 406, the net is updated using a second transaction function at block 410. The aggregate net is sliced into individual nets by the second transaction function at block 412. Each of the individual nets in the aggregate net is updated by the second transaction function at block 414.

In some embodiments, aggregate nets are used to efficiently perform signal conversions in mixed HDL language simulations. When crossing a language boundary between modules written in different HDL formats, aggregate nets may be created in the target language for all the formals making the port maps. The aggregate element array for each of the created aggregate nets is filled using the corresponding actuals, which are in the language of the parent. When updating an aggregate net, the transaction function checks to determine if the net actual is in the same format as the aggregate net. If the net is not the same HDL format as the corresponding actual, decision block 416 directs control to block 418 where the value of the net is converted to the HDL format of the actual.

The net actual is updated to the new net value by calling the first transaction function corresponding to the net actual at block 420. In some implementations, the aggregate net may include memory to buffer values of the actuals of the aggregate net. In such implementations, a portion of the memory, corresponding to the net actual that was updated at block 420 is updated at block 422 using the updated net values.

Examples 2 and 3 show pseudo code of some example data structures and transaction functions that may be used for simulation in accordance with one or more embodiments. Example 2 shows an example set of data structures that may be used to model netviews and nets at simulation runtime.

```
enum net_enum {
    VHDL_NET,
    VERILOG_NET,
    VHDL_AGGREGATE_NET,
    VLOG_AGGREGATE_NET
};
struct core_net {
    net_enum kind;
```

```
void* transaction_func; // function for updating net
    value
char* last value; // where is the last value for this net
char* last event; // where is the last event array stored for
    this net
};
struct declared_net {
    core_net core;
    char value[1]; // inline variable size value
};
    struct aggregate_net{
    core_net core;
    aggregate_net_element* aggregate_element_start;
    unsigned aggregate_element_count;
    char value[1]; // inline variable size value
};
struct aggregate_net_element{
    core_net* actual;
    unsigned_tuple actual_slice;
    unsigned_tuple formal_slice;
};
struct net_view{
    core_net* net;
    char* value; // used by generated code for reading net
        value
    unsigned offset; // value offset with respect to the net
};
```

EXAMPLE 2

```
EXAMPLE 3 shows an example set of transaction func-
tions that may be used to update nets at simulation runtime.
schedule_transaction_net_vhdl(declared_net* net, char*
    new_value, unsigned offset, unsigned size) {
    // Core of VHDL scheduling code
}
schedule_transaction_net_vlog(declared_net* net, char*
    new_value, unsigned offset, unsigned size) {
    // Core of Verilog scheduling code
}
schedule_transaction_aggregate_net_vhdl(aggregate_
    net* net, char* new_value, unsigned offset, unsigned
    size){
    for (unsigned i=0, e<net->aggregate_element_count;
      i !=e; ++i) {aggregate_net_element* ele=net->aggre-
      gate_element_start[i];
      // [1] check if the new value falls in the range of
        aggregate element
      // [2] if the new value falls in range then calculate the
        offset,
      // size and slice of the value for the aggregate element
      // [2.1] if the target net is different value, convert the
        value
      // to the target net type
      // [2.2] schedule the transaction on the target net
    }
}
schedule_transaction_aggregate_net_vlog(aggregate_
    net* net, char* new_value, unsigned offset, unsigned
    size){
}
schedule_transaction_netview(net_view* view,  char*
    new_value, unsigned offset, unsigned size){
    offset+=view->offset;
    if (view->net->kind==VHDL_NET)
      schedule_transaction_net_vhdl(view->net,
        new_value, offset, size);
    else if (view->net->kind==VLOG_NET)
      schedule_transaction_net_vlog(view->net,
        new_value, offset, size);
    else  if  (view->net->kind==VHDL_AGGREGATE_
      NET)
      schedule_transaction_aggregate_net_vhdl(view->
        net, new_value, offset, size);
    else
      schedule_transaction_aggregate_net_vlog(view->
        net, new_value, offset, size);
}
```

EXAMPLE 3

As described with reference to FIG. 4, aggregate nets have respective transaction functions for updating net values of the respective net data structure shown in Example 2. Transaction functions for nets are called by the simulation kernel when the transactions for those nets mature. Scheduling of a transaction involves calling a simulation kernel function schedule_transaction_netview( ), where the net view object, new value, offset of the new value with respect to the net view, together with the size of new value is passed in. Because this step only requires access to the net view from the generated code, the same generated code can be used for all identical instances of a design unit.

As shown in Examples 2 and 3, different transaction functions and data structures may be implemented for different types of nets. Schedule_transaction_netview( ) schedules the correct transaction function based on type of net indicated by the net view object. It adds its own offset, with respect to the net, to an offset passed in by the caller to produce an absolute offset with respect to the net. This function has a special check for aggregate nets for which it forwards the call to a special schedule_transaction_aggregate_net( ). This special function divides the new scheduled value into segments corresponding to the aggregate elements that make up the aggregate signal, and in turn, schedules the sliced values on the elements making up the aggregate net. For this purpose, aggregate_net_element array associated with the aggregate net is utilized.

Figure 5:
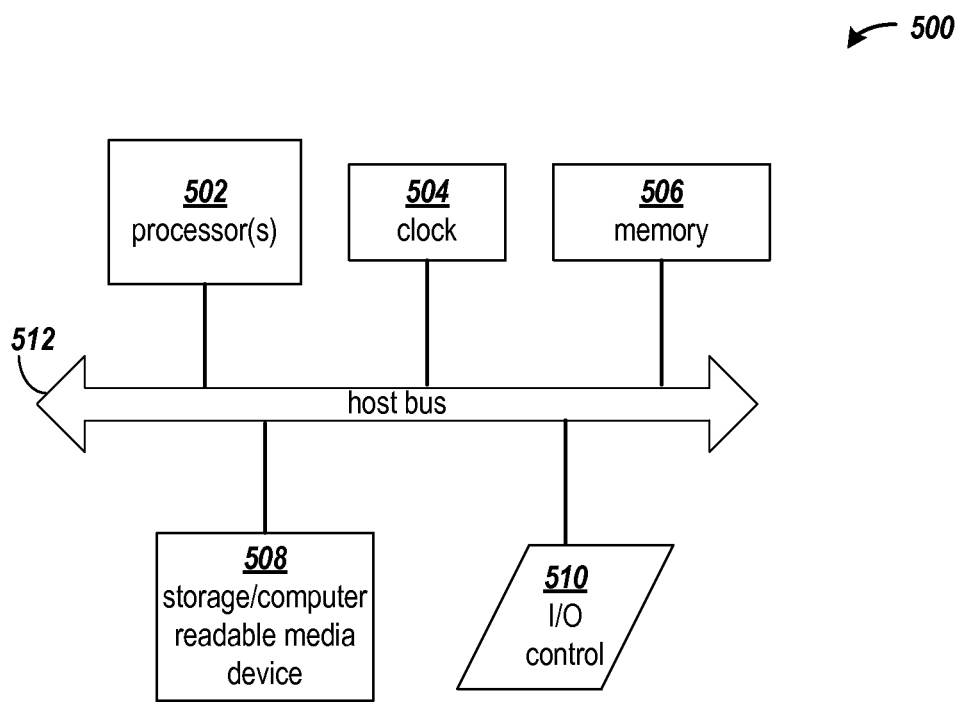
FIG. 5 shows a computing arrangement that may be configured to perform the processes of the various embodiments.

FIG. 5 shows a block diagram of an example computing arrangement that may be configured to implement the compilation and/or simulation processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory unit 506, a storage unit 508, and an input/output control unit 510 coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory 506 and storage 508 may be combined in a single arrangement.

The processor arrangement 502 executes the software in storage 508 and/or memory 506 arrangements, reads data from and stores data to the storage 508 and/or memory 506 arrangements, and communicates with external devices through the input/output control arrangement 510. These functions are synchronized by the clock signal generator 504. The resource of the computing arrangement may be managed by either an operating system (not shown), or a hardware control unit (not shown).

The embodiments may be applicable to a variety of systems for HDL simulation. Other aspects and embodiments will be apparent from consideration of the specification. It is intended that the specification and illustrated embodiments be considered as examples only, with a true scope of the embodiments being indicated by the following claims.

What is claimed is:

1. A method for compiling a hardware description language (HDL) specification for simulation of a circuit design, the method comprising using one or more processors to perform operations including:
   elaborating the circuit design from the HDL specification, the circuit design including instances of a plurality of modules; and
   generating and storing on a storage device, simulation code that models the circuit design, the simulation code including:
      for each hardware configuration of each of the plurality of modules, a respective first function configured and arranged to model the hardware configuration of the module using a set of nets indicated in one or more arguments of the function; and
      a second function configured and arranged to simulate first and second ones of the instances that have a same hardware configuration of a same one of the plurality of modules, by performing operations including:
         in response to an indication to simulate the first instance, executing a function call to the respective first function, corresponding to the hardware configuration and module of the first and second instances, with a first set of nets corresponding to the first instance indicated by one or more arguments in the function call; and
         in response to an indication to simulate the second instance, reexecuting the function call to the respective first function, with a second set of nets corresponding to the second instance indicated by the one or more arguments in the function call.

2. The method of claim 1, wherein:
   the HDL specification indicates formals that are declarations of inputs and outputs of each instance, actuals that are signal values passed to and from the formals during simulation runtime, and nets connecting the formals to the actuals; and
   the operations further including:
      for each formal that is connected to only one actual in an instance, determining the net used by the formal; and
      for each formal that is connected to multiple actuals in an instance:
         determining an aggregate set of nets used by the formal; and
         generating and storing on the storage device a respective data structure that indicates the aggregate set of nets used by the formals of the instance, and indicates, for each of the nets in the aggregate set, which bits of those nets are used by the formal of the instance.

3. The method of claim 2, wherein the respective data structure includes, for each formal that is connected to multiple actuals in the instance:
   a reference pointer to a memory location containing values of bits of the aggregate set of nets; and
   a data value indicating an offset within the memory location for the bits used by the formal.

4. The method of claim 3, wherein the respective data structure further includes, for each formal of the instance connected to a single actual:
   a reference pointer to a memory location containing values of bits of the net connecting the formal and the single actual; and
   a data value indicating an offset within the memory location for the bits used by the formal.

5. The method of claim 3, wherein the values of the bits of the aggregate set of nets are contiguously stored in the memory location.

6. The method of claim 2, the operations further including:
   for each net in the aggregate set of nets, creating a corresponding update function that updates values of bits of the net.

7. The method of claim 6, wherein the update function is configured to convert bit values of the aggregate set of nets from a first HDL data format to a second HDL data format.

8. The method of claim 2, the operations further including traversing a hierarchy of each of the aggregate set of nets to map formals to actuals.

9. The method of claim 2, wherein the generating of the simulation code includes generating, and storing on the storage device, executable code configured to, in response to a change in the value of a driver of a net by one of the two or more instances:
   in response to determining that the net is not a net in one of the aggregate sets of nets indicated by the corresponding data structure, update a first memory location corresponding to the actual of the net with an updated value using a first update function; and
   in response to determining that the net is a net in one of the aggregate sets of nets indicated by the corresponding data structure, execute a second update function configured to:
      divide an updated value of the aggregate set of nets into segments corresponding to respective temporary memory locations of the aggregate set of nets;
      for each of the nets in the aggregate set of nets, execute the update function to update the first memory location corresponding to the actual of the net with a corresponding one of the segments of the updated value; and
      update the value of a second memory location corresponding to the aggregate set of nets.

10. The method of claim 2, the operations further including:
in response to a net in the aggregate set of nets being a net in a second aggregate set of nets, replacing the net in the aggregate set with the nets included in the second aggregate set of nets.

11. A method of simulating a circuit design having first and second instances of a module with a same hardware configuration, using a compiled hardware description language (HDL) specification of the circuit design, the compiled HDL specification including a first function including simulation code configured and arranged to model the module, the method comprising:
using one or more processors to perform operations including:
in response to an indication to simulate the first instance, executing a function call to the first function with a first set of nets corresponding to the instance indicated by one or more arguments in the function call; and
in response to an indication to simulate the second instance, reexecuting the function call to the first function with a second set of nets corresponding to the instance indicated by one or more arguments in the function call; and
wherein:
the HDL specification indicates formals that are declarations of inputs and outputs of each instance, actuals that are signal values passed to and from the formals during simulation runtime, and nets connecting the formals to the actuals;
the compiled HDL specification includes, for each of the first and second instances of the module having a formal connected to multiple actuals, a respective data structure that indicates the aggregate sets of nets used by the formals of its instance, and indicates, for each of the nets in an aggregate set, which bits of those nets are used by the formal of the instance; and
the executing of the first portion of simulation code using a respective set of nets corresponding to the instance includes, for each formal of the instance, using the corresponding data structure of the instance to determine bits of the nets used by formals of the instance.

12. The method of claim 11, wherein, for each formal of the instance that is connected to multiple actuals:
the data structure includes a reference pointer to a memory location containing values of bits of the aggregate set of nets, and a data value indicating an offset within the memory location for the bits used by the formal of instance; and
the determining of bits of the net used by formals of the instance includes determining a memory location of the bits used by the formal by applying the offset to the memory location indicated by the reference pointer.

13. The method of claim 12, wherein, for each formal of the instance connected to a single actual:
the data structure further includes a reference pointer to a memory location containing values of bits of the single net; and
the determining of bits of the net used by the formal includes using the reference pointer to determine the memory location containing the values of bits of the single net.

14. The method of claim 12, the operations further including:
updating values of bits of one of the aggregate set of nets using a contiguously block of memory corresponding to the aggregate set of nets.

15. The method of claim 11, the operations further including:
for each net of the aggregate set of nets, in response to a change in a driver of the aggregate set of nets, updating the values of the aggregate set of nets using a respective update function associated with the aggregate set of nets.

16. The method of claim 15, wherein the update function associated with the aggregate set of nets is configured to convert bit values of the aggregate set of nets from a first HDL data format to a second HDL data format.

17. The method of claim 11, the operations further including, in response to a change in the value of a driver of a net by one of multiple instances of the module:
in response to determining that the net is not a net in one of the aggregate set of nets indicated by the corresponding data structure, updating a first memory location corresponding to the actual of the net with an updated value using a first update function; and
in response to determining that the net is a net in one of the aggregate set of nets indicated by the corresponding data structure, execute a second update function configured to:
divide an updated value of the aggregate set of nets into segments corresponding to respective temporary memory locations of nets in the aggregate set;
for each net in the aggregate set, execute a respective update function to update the temporary memory location of the net in the aggregate set; and
update the value of a second memory location corresponding to the aggregate set of nets.

18. An article of manufacture, comprising:
a non-transitory electronically readable medium having stored instructions that when loaded into a processor, cause the processor to receive and compile a hardware description language (HDL) specification for simulation of a circuit design by performing operations including:
elaborating the circuit design from the HDL specification;
determining two or more instances of a module of the elaborated design that have a same hardware configuration; and
generating and storing on a storage device, simulation code that models the circuit design, the simulation code including:
a first portion of simulation code configured and arranged to model the module having the hardware configuration; and
a second portion of simulation code configured and arranged to, for each of the two or more instances, in response to an indication to simulate the instance, execute the first portion of simulation code using a respective set of nets corresponding to the instance
wherein:
the HDL specification indicates formals that are declarations of inputs and outputs of each module, actuals that are signal values passed to and from the formals during simulation runtime, and nets connecting the formals to the actuals; and
the instructions further cause the processor to perform operations including:

for each formal of a module that is connected to an actual for only one instance of the module, determining the net used by the formal; and for each formal of a module that is connected to actual of multiple instances of the module:
- determining an aggregate set of nets used by the formal; and
- generating and storing on the storage device a respective data structure that indicates the aggregate sets of nets used by the formal, and indicates for each instance of the module, bit of the aggregate set of nets used by the formal of the instance.

* * * * *